United States Patent
Fasoli et al.

(10) Patent No.: US 7,554,406 B2
(45) Date of Patent: Jun. 30, 2009

(54) SPATIALLY DISTRIBUTED AMPLIFIER CIRCUIT

(75) Inventors: Luca G. Fasoli, San Jose, CA (US); Ali K. Al-Shamma, Mountain View, CA (US); Kenneth K. So, Belmont, CA (US)

(73) Assignee: SanDisk 3D LLC, Milpitas, CA (US)

( * ) Notice: Subject to any disclaimer, the term of this patent is extended or adjusted under 35 U.S.C. 154(b) by 11 days.

(21) Appl. No.: 11/695,017

(22) Filed: Mar. 31, 2007

(65) Prior Publication Data

US 2008/0238541 A1    Oct. 2, 2008

(51) Int. Cl.
H03F 3/60 (2006.01)
(52) U.S. Cl. ...................................... 330/286
(58) Field of Classification Search ................. 330/53, 330/54, 277, 286, 295, 311
See application file for complete search history.

(56) References Cited

U.S. PATENT DOCUMENTS

| | | | |
|---|---|---|---|
| 5,301,152 A | 4/1994 | Iwashita | |
| 5,572,474 A | 11/1996 | Sheen et al. | |
| 5,920,230 A * | 7/1999 | Beall | 330/54 |
| 6,034,882 A | 3/2000 | Johnson et al. | |
| 6,154,064 A | 11/2000 | Proebsting | |
| 6,191,989 B1 | 2/2001 | Luk et al. | |
| 6,400,227 B1 * | 6/2002 | Goldfarb et al. | 330/295 |
| 6,420,215 B1 | 7/2002 | Knall et al. | |
| 6,525,953 B1 | 2/2003 | Johnson | |
| 6,545,898 B1 | 4/2003 | Scheuerlein | |
| 6,768,380 B2 * | 7/2004 | Hong et al. | 330/286 |
| 6,856,572 B2 | 2/2005 | Scheuerlein et al. | |
| 6,859,410 B2 | 2/2005 | Scheuerlein et al. | |
| 6,879,505 B2 | 4/2005 | Scheuerlein | |
| 6,952,030 B2 | 10/2005 | Herner et al. | |
| 6,952,043 B2 | 10/2005 | Vyvoda et al. | |
| 7,054,219 B1 | 5/2006 | Petti et al. | |
| 7,142,471 B2 | 11/2006 | Fasoli et al. | |
| 7,272,052 B2 | 9/2007 | Scheuerlein et al. | |
| 7,276,976 B2 * | 10/2007 | Oh et al. | 330/311 |
| 7,286,439 B2 | 10/2007 | Fasoli et al. | |
| 7,298,665 B2 | 11/2007 | So et al. | |
| 2002/0130720 A1 * | 9/2002 | Pavio et al. | 330/286 |
| 2005/0158950 A1 | 7/2005 | Scheuerlein et al. | |
| 2006/0250836 A1 | 11/2006 | Herner et al. | |

(Continued)

OTHER PUBLICATIONS

Baek et al., "Multi-layer Cross-point Binary Oxide Resistive Memory (OxRRAM) for Post-NAND Storage Application," IEEE International Electron Devices Meeting Technical Digest, Dec. 2005, pp. 750-753 (4 pages).

(Continued)

*Primary Examiner*—Khanh V Nguyen
(74) *Attorney, Agent, or Firm*—Zagorin O'Brien Graham LLP

(57) ABSTRACT

An exemplary amplifier circuit includes a first group of spatially distributed final amplifier stages having a first configuration, and a second group of spatially distributed final amplifier stages having a second configuration different than the first configuration. Both groups share the same control node for their respective final amplifier stages, and both groups share the same amplifier output node. Each group is typically enabled at a time that the other is disabled. In certain embodiments incorporating a memory array, only one critical analog node must be routed throughout the memory array.

26 Claims, 8 Drawing Sheets

U.S. PATENT DOCUMENTS

| | | |
|---|---|---|
| 2006/0250837 A1 | 11/2006 | Herner et al. |
| 2006/0268626 A1 | 11/2006 | Hamzaoglu et al. |
| 2006/0279360 A1* | 12/2006 | Shigematsu ................ 330/286 |
| 2007/0072360 A1 | 3/2007 | Kumar et al. |
| 2007/0090425 A1 | 4/2007 | Kumar et al. |
| 2007/0236981 A1 | 10/2007 | Herner |

OTHER PUBLICATIONS

Baek et al., "Highly Scalable Non-volatile Resistive Memory using Simple Binary Oxide Driven by Asymmetric Unipolar Voltage Pulses," IEEE International Electron Devices Meeting Technical Digest, Dec. 2004, pp. 587-590 (4 pages).

Crowley, Matthew, et al., "512Mb PROM with 8 Layers of Antifuse/Diode Cells," IEEE International Solid-State Circuits Conf., vol. XLVI, pp. 284-285, Feb. 2003.

Hwang et al., "Writing Current Reduction for High-Density Phase-Change RAM," IEEE International Electron Devices Meeting Technical Digest, Dec. 2003, pp. 893-896 (4 pages).

Johnson, Mark, et al., "512-Mb PROM with a Three-Dimensional Array of Diode/Antifuse Memory Cells," IEEE Journal of Solid-State Circuits, vol. 38, pp. 1920-1928, Nov. 2003.

Pirovano et al., "Electronic Switching in Phase-Change Memories," IEEE Transactions on Electronic Devices, vol. 51, No. 3, Mar. 2004, pp. 452-459 (8 pages).

U.S. Appl. No. 11/695,015, filed Mar. 31, 2007, entitled "Method for Using a Spatially Distributed Amplifier Circuit," naming inventors Luca G. Fasoli, Ali K. Al-Shamma and Kenneth K. So (023-0043).

* cited by examiner

SPATIALLY DISTRIBUTED AMPLIFIER CIRCUIT

CROSS-REFERENCE TO RELATED APPLICATION(S)

This application is related to the following co-pending U.S. Applications, each of which is incorporated by reference herein in its entirety:

U.S. application Ser. No. 11/695,015 entitled "Method for Using a Spatially Distributed Amplifier Circuit" by Luca G. Fasoli, Ali K. Al-Shamma, and Kenneth K. So, filed on even date herewith.

BACKGROUND

1. Field of the Invention

The present invention relates to amplifier circuits, and particularly to amplifier circuits having distributed parallel amplifier stages.

2. Description of the Related Art

Amplifier circuits sometimes include an amplifier stage that is implemented with multiple parallel transistors instead of just one transistor. For example, a precision differential amplifier circuit may include a differential pair of transistors in a first amplifier stage. Each of two transistors forming this differential pair may actually be implemented as multiple (e.g., four, eight, or sixteen) individual transistors connected in parallel. However, individual transistors of both the first and second differential pair transistors are spatially intermixed with each other in a two dimensional array. In this fashion, differences in transistor characteristics that result from a gradient of a parameter across the semiconductor device tend to cancel out and result in a lower offset voltage of the differential amplifier. Such gradients could include variations in doping density, temperature, electrical or magnetic field, mobility, threshold voltage, and others. Such multiple devices in an amplifier circuit are usually implemented in a tight localized area to minimize the magnitude of any parametric differences caused by the gradient thereacross, even though the interspersed physical arrangement is helpful in reducing (or even canceling out) the effects of such gradients on the offset of the amplifier.

In other amplifiers, such multiple parallel stages may be spatially distributed across a large area of a circuit. For example, an amplifier may be configured to deliver a high current to an output node which traverses a large area of an integrated circuit, but such output current may be drawn out locally at any location along the output node. In such a case, distributing the final amplifier stage (or driver stage) over a wide area places many of the final stages closer to the actual output current load. This can reduce the output node sensitivity to wiring resistance, noise coupling, and other effects.

Referring now to FIG. 1, an amplifier circuit 100 generates an output signal on an amplifier output node 102 which is distributed throughout a memory array 104. Two amplifiers are shown, one at the bottom of the figure, and the other at the top of the figure. The first amplifier includes a plurality of spatially distributed output driver NMOS transistors 116, 117, 118, each of which has a drain terminal coupled to a power supply node (e.g., here shown as a VDD node), a gate terminal coupled to a CTRL_A control node 114, and a source terminal coupled to the amplifier output node 102. When this amplifier is enabled by an ENABLE_A signal conveyed on node 112 (i.e., also referred to as the "enable 112" signal), the amplifier output node 102 is compared against a reference voltage VREF_A conveyed on node 113, and the CTRL_A signal 114 is generated accordingly. The distributed NMOS driver transistors 116, 117, 118 are in a source follower configuration, with the amplifier output node 102 voltage being lower than the CTRL_A voltage.

The second amplifier includes a plurality of spatially distributed output driver PMOS transistors 126, 127, 128, each of which has a drain terminal coupled to the power supply node, a gate terminal coupled to a CTRL_B control node 124, and a source terminal coupled to the amplifier output node 102. When this amplifier is enabled by an ENABLE_B signal conveyed on node 122 (i.e., also referred to as the "enable 122" signal), the amplifier output node 102 is compared against a reference voltage VREF_B conveyed on node 123, and the CTRL_B signal conveyed on node 124 is generated accordingly. The distributed PMOS driver transistors 126, 127, 128 are in a common gate amplifier configuration, with the amplifier output node 102 voltage being higher than the CTRL_B voltage.

Many integrated circuits utilize tungsten metallization for interconnect wiring, particularly if high temperature operations are required after deposition of such a wiring layer. Such tungsten interconnect lines have a much higher resistance (e.g., 1.3 Ohms/square) than aluminum or copper-doped aluminum (e.g., 0.04 Ohms/square). Certain 3D memory architectures may require using tungsten for power distribution under the memory array because of the high temperatures required to form memory cells on each of the multiple memory planes. In addition, diode-based memory arrays may require regulating the unselected word line and unselected bit line voltages in the selected array blocks. Due to the reverse current of the unselected diodes, a substantial current may flow through the unselected memory cells while regulating the voltage of the unselected word lines and unselected bit lines. This current can be concentrated in a very small area, yet the particular area of current flow can occur anywhere within the array (i.e., over a wide range of area).

Using an amplifier with distributed drivers (i.e., more generally "final amplifier stages") alleviates these problems, as it can provide very low output resistance somewhat independent from the position of the current load (i.e. from the position of the selected array block). If different voltage levels are required for read or write, two different amplifiers may be utilized, sharing the same output node, but each with multiple drivers distributed throughout the array (i.e. one for read, one for write, as in the above example). Each such amplifier requires a sensitive controlling node to drive its group of drivers. As memory array become increasingly dense, routing each of the control nodes becomes more difficult. This is particularly true in a three-dimensional memory array where routing freedom is limited.

SUMMARY

Generally, two amplifier circuits, each including a plurality of spatially distributed final amplifier stages, may share the same control node of the final stages of the amplifiers for different amplifier configurations. Each is typically enabled at a time that the other is disabled, and both may share the same amplifier output node. As such, only one critical analog node must be routed throughout an area of an integrated circuit, such as a memory array.

In certain embodiments of the invention as applied in a memory array, one group of memory cells may be enabled for write and another group enabled for read, to thereby provide a read-while-write architecture. For example, a first memory block, memory array, memory core, or other physical grouping of memory cells (generally referred to herein as a memory array) may be enabled for write, and a corresponding write amplifier may be enabled to provide a write voltage on the common amplifier output line for the first grouping of memory cells, yet a second physical grouping of memory cells may be enabled for read, and a corresponding read amplifier may be enabled to provide a read voltage on the common amplifier output line for the second physical grouping of memory cells. Within each of the first and second physical grouping of memory cells, the corresponding amplifiers may share a common sensitive controlling node.

In one aspect the invention provides a circuit which, in an exemplary embodiment, includes an amplifier control node, an amplifier output node. The exemplary circuit further includes a first plurality of spatially distributed final amplifier stages, each having a respective input coupled to the amplifier control node, each having a respective output coupled to the amplifier output node, and each comprising a first circuit configuration. The exemplary circuit still further includes a second plurality of spatially distributed final amplifier stages, each having a respective input coupled to the amplifier control node, each having a respective output coupled to the amplifier output node, and each comprising a second circuit configuration different from the first circuit configuration.

The invention in several aspects is particularly suitable for implementation within an integrated circuit, including those integrated circuits having a memory array, for methods for operating such circuits, for systems incorporating such circuits, and for computer readable media encodings of such circuits, all as described herein in greater detail and as set forth in the appended claims. A wide variety of such integrated circuits is specifically contemplated, including those having a three-dimensional memory array formed above a substrate.

The invention is particularly useful when used with certain erasable memory array technologies, such as those incorporating certain resistive passive element memory cells. Such cells tend to have high leakage current when programming and erasing, and a memory array, particularly a three-dimensional memory array, therefore requires large spatially-localized currents at the required programming and erasing voltages.

The foregoing is a summary and thus contains, by necessity, simplifications, generalizations and omissions of detail. Consequently, those skilled in the art will appreciate that the foregoing summary is illustrative only and that it is not intended to be in any way limiting of the invention. Moreover, the inventive aspects described herein are contemplated to be used alone or in combination. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
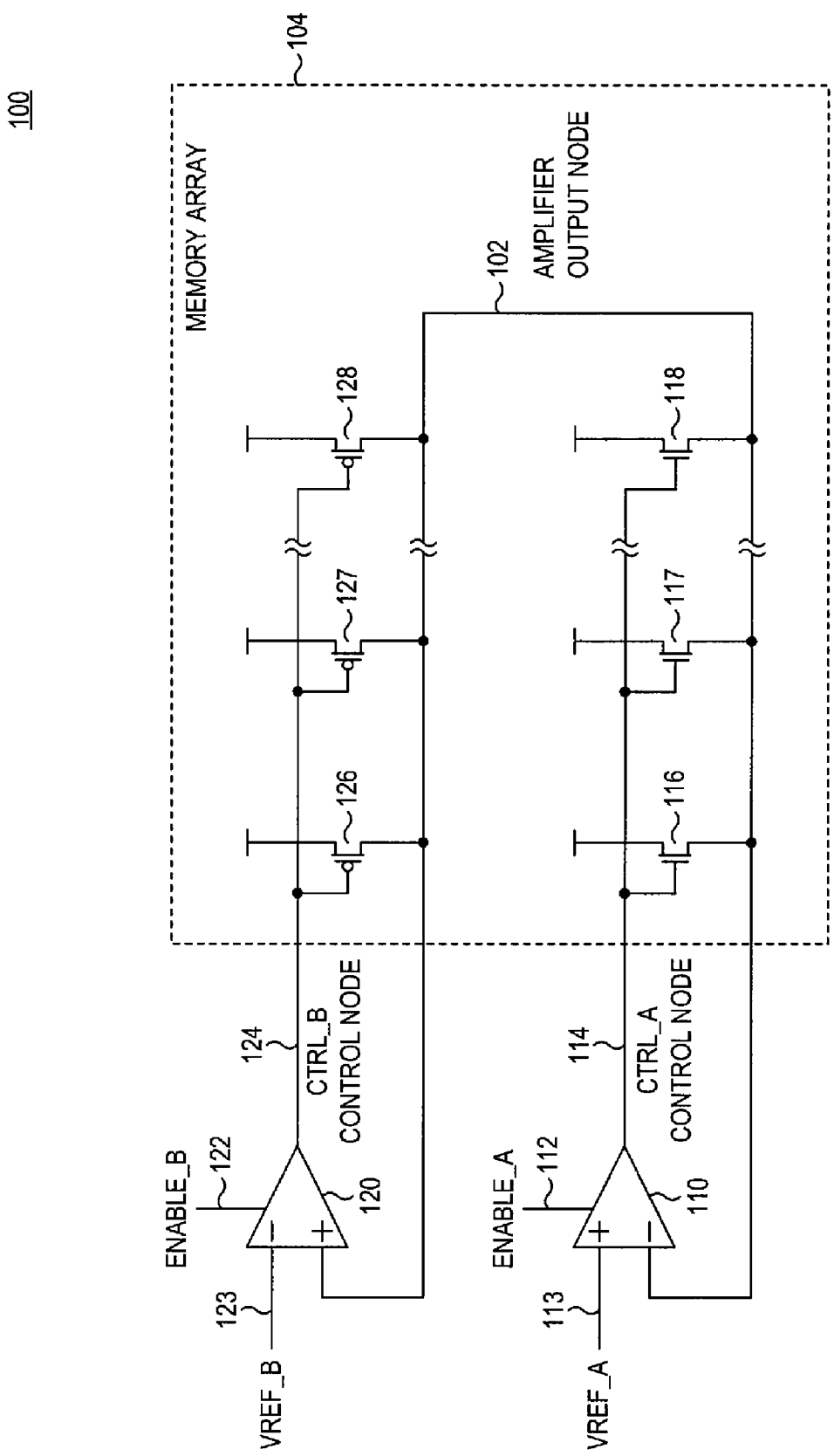
FIG. 1 is a schematic diagram of a prior art amplifier circuit.
Figure 2:
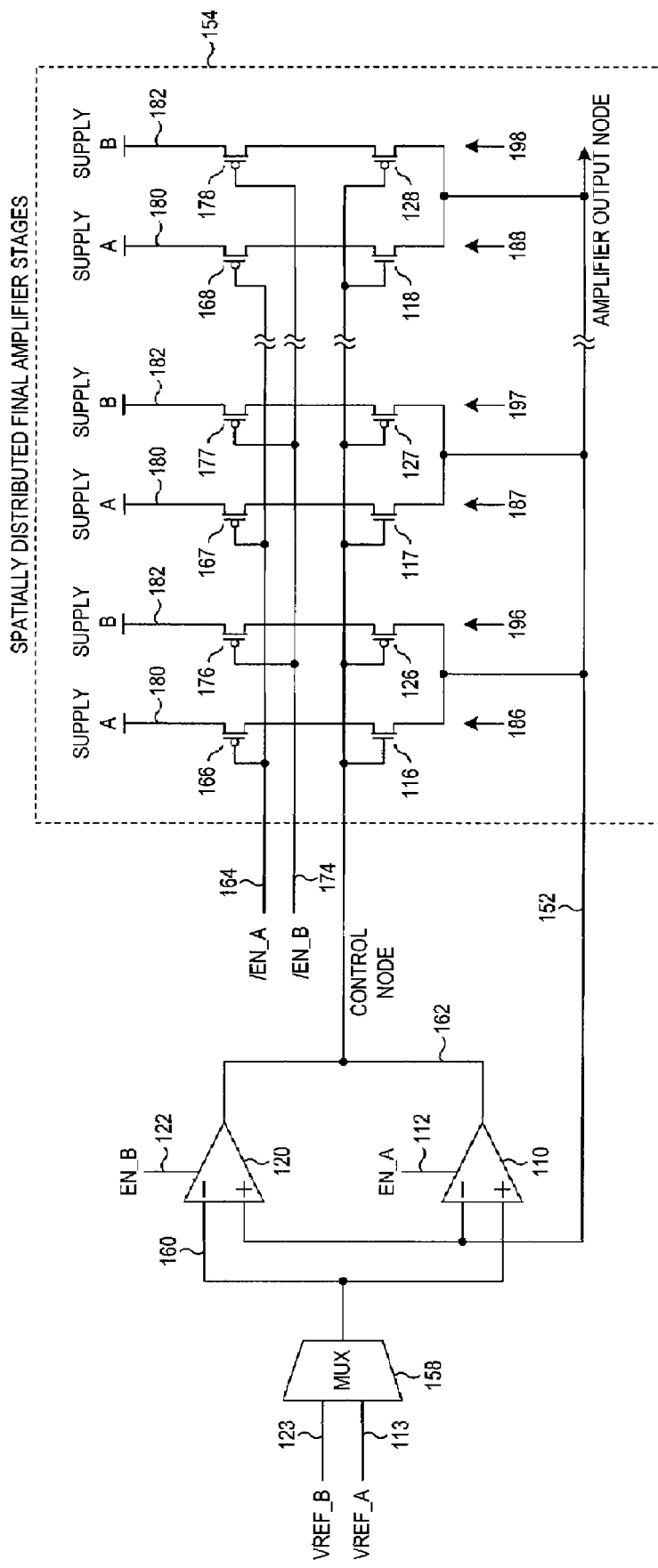
FIG. 2 is a schematic diagram of an amplifier circuit in accordance with certain embodiments of the present invention.

Referring now to FIG. 2, an amplifier circuit 150 generates an output signal on a shared amplifier output node 152 which is distributed throughout a memory array 154. Two amplifiers are shown, each with its own set of distributed final amplifier stages, but both amplifiers sharing the same amplifier output node 152. The first amplifier includes a respective plurality of spatially distributed final amplifier stages 186, 187, 188, each of which includes a source follower output driver transistor (e.g., NMOS transistor 116) in series with a switch device responsive to an enable signal (e.g., PMOS transistor 166). Each of the source follower transistors 116, 117, 118 has its gate terminal coupled to a control node 162, and its source terminal coupled to the amplifier output node 152. When this amplifier is enabled, the /EN_A enable signal (i.e., Enable A "bar" or complement) conveyed on node 164 is active (e.g., in this case, low) to turn on each of the PMOS switch devices 166, 167, 168 and thereby enable each of the final amplifier stages 186, 187, 188. In addition, an EN_A signal conveyed on node 112 is active to enable the differential amplifier circuit 110 (also sometimes referred to herein as a "preamplifier" circuit or a "comparator" circuit). The amplifier output node 152 is compared against a reference voltage VREF_A conveyed on node 113, through multiplexer 158, and onto amplifier input node 160, and the shared control node signal conveyed on node 162 is generated accordingly. The distributed NMOS driver transistors 116, 117, 118 are in a source follower configuration, with the amplifier output node 152 voltage being lower than the control node 162 voltage (when enabled).

The second amplifier includes a respective plurality of spatially distributed final amplifier stages 196, 197, 198, each of which includes a common gate output driver transistor (e.g., PMOS transistor 126) in series with a switch device responsive to an enable signal (e.g., PMOS transistor 176). Each of the common gate transistors 126, 127, 128 has its gate terminal coupled to the shared control node 162, and its drain terminal coupled to the amplifier output node 152. When this amplifier is enabled, the /EN_B enable signal conveyed on node 174 is active (e.g., in this case, low) to turn on each of the switch devices 176, 177, 178 and thereby enable each of the final amplifier stages 196, 197, 198. In addition, an EN_B signal conveyed on node 122 is active to enable the differential amplifier circuit 120. The amplifier output node 152 is compared against a reference voltage VREF_B conveyed on node 123, through multiplexer 158, and onto amplifier input node 160, and the shared control node 162 signal (e.g., voltage) is generated accordingly. The distributed PMOS driver transistors 126, 127, 128 are in a common gate configuration, with the output node 152 voltage being higher than the control node 162 voltage (when enabled).

In this embodiment, the final amplifier stages 186, 187, 188 for the "A" amplifier are coupled to a power supply voltage SUPPLY A conveyed on node 180, while the final amplifier stages 196, 197, 198 for the "B" amplifier are coupled to a separate power supply voltage SUPPLY B conveyed on node 182. In other embodiments, the final amplifier stages for the two (or more) amplifiers may be coupled to the same power supply node, as shown in embodiments described hereinbelow.

Figure 4:
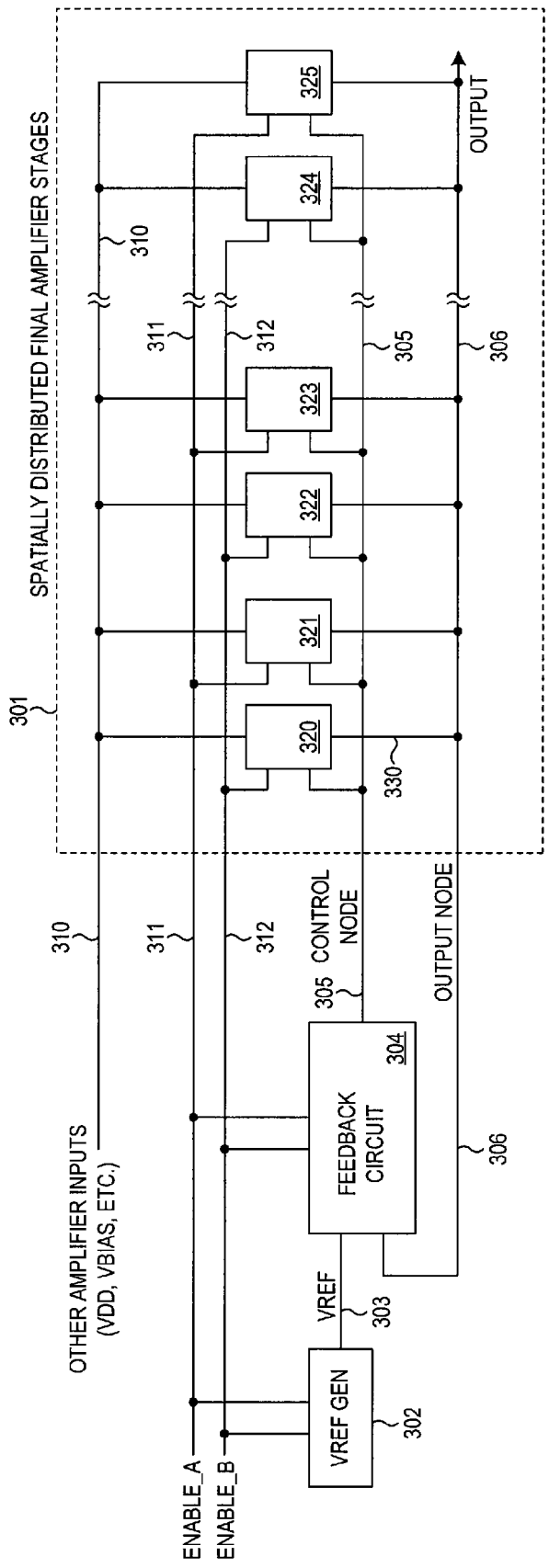
FIG. 4 is a block diagram of an amplifier circuit in accordance with certain embodiments of the present invention.

In this embodiment, one of the two reference voltages VREF_A and VREF_B is selected by a multiplexer 158 and conveyed to a common input node for both amplifiers. In other embodiments, each reference voltage may be directly coupled to its corresponding amplifier. In still other embodiments, a single reference generator circuit (not shown) may have a single VREF output coupled to a common amplifier input node, such as node 160, and the voltage of the VREF output changed depending on which of the two amplifiers is enabled (e.g., as shown in FIG. 4).

In an exemplary usage, the A amplifier having the source follower final stages may be used during a read mode to provide a suitable voltage on the output node 152 to certain array lines in the memory array. For example, such a read-mode voltage may be conveyed to unselected word lines within one or more memory blocks within the memory array. The B amplifier having the common gate final stages may be used during a write mode to provide a suitable voltage on the output node 152 to certain array lines in the memory array. For example, such a write-mode voltage may be conveyed to unselected word lines within one or more memory blocks within the memory array. The common gate configuration allows such a regulated write-mode voltage to be higher than if using the source follower configuration, yet the source follower configuration allows such a read-mode voltage to be generated with greater stability and better transient response.

The final stages for both amplifiers are distributed throughout the memory array (even though only three such final stages are shown in the figure). Both amplifiers share the control node 162, which is a sensitive analog node, and thus only a single analog node is distributed throughout the memory array. Switching between one amplifier and the other is done by enabling one set of final amplifier stages (e.g., enabling a conductive path through one set of stages) and enabling the remainder of the circuitry for the amplifier (e.g., the differential amplifier circuit 110 or 120).

Each of the plural final amplifier stages may be viewed as having an input which is coupled to the common control node, and having an output which is coupled to the amplifier output node. For example, the gate terminal of transistor 116 may be viewed as the input of the final amplifier stage 186. In addition, each of the plural final amplifier stages may be viewed as having an enable input which is coupled to a corresponding enable signal. For example, the gate terminal of transistor 166 may be viewed as the enable input of the final amplifier stage 186, which is coupled to the /EN_A signal. In other configurations, the final stage input terminal and enable input terminal may be other than the gate terminal of a transistor.

Figure 3:
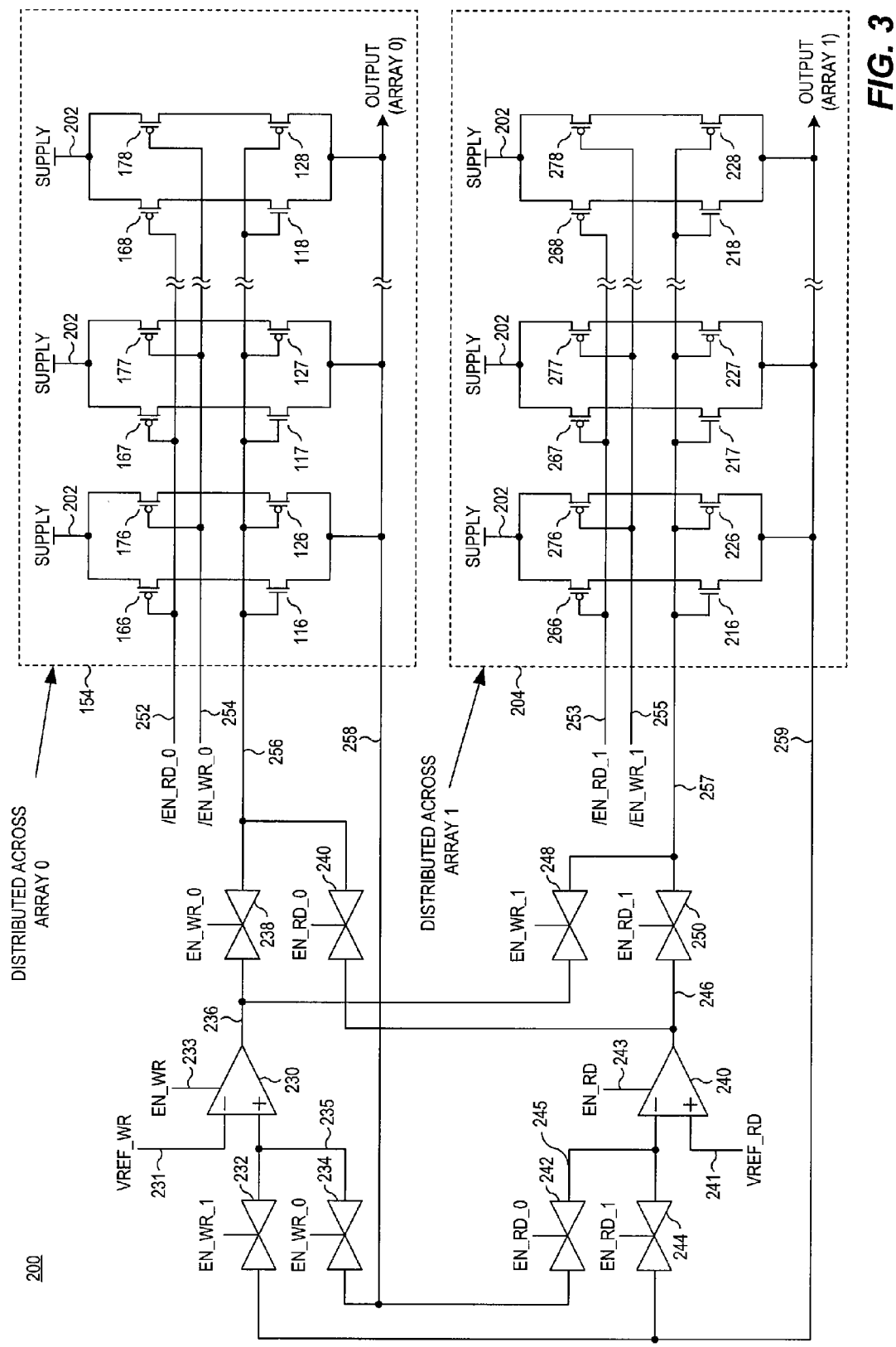
FIG. 3 is a schematic diagram of another amplifier circuit in accordance with certain embodiments of the present invention.

Referring now to FIG. 3, an amplifier circuit 200 is shown which provides a read-mode voltage to one memory array which is enabled for read, and simultaneously provides a write-mode voltage to another memory array which is enabled for write. As before, within a given memory array the common control node is shared by the read and write amplifiers within that memory array, and by changing the state of several logic switches external to the memory array, the voltage generated on the amplifier output node for a given array may be brought to the read-mode level or to the write-mode level.

One of the memory cores (i.e., memory array 0) is labeled 154, which corresponds generally to that shown in FIG. 2, except here the distributed final amplifier stages for both amplifiers are shown as sharing the same power supply node 202. In addition, the source follower final amplifier stages are enabled by a /EN_RD_0 enable signal conveyed on node 252, and the common gate final amplifier stages are enabled by a /EN_WR_0 enable signal conveyed on node 254. The common control node is labeled 256, and the common amplifier output node is labeled 258.

A second memory core (i.e., memory array 1) is labeled 204, which is identical in structure to memory core 154. In this array, the source follower final amplifier stages are enabled by a EN RD 1# signal conveyed on node 253, and the common gate final amplifier stages are enabled by a EN WR 1# signal conveyed on node 255. The common control node is labeled 257, and the common amplifier output node is labeled 259.

A single write amplifier comparator 230 (i.e., differential amplifier) is used to provide a suitable level on the common control node for the memory array that is enabled for write. For example, if memory array 154 is enabled for write, the amplifier output node 258 is coupled through switch 234 to the non-inverting input node 235 of comparator 230, whose output is coupled through switch 238 to the common control node 256. The switches 232 and 240 remain off. Consequently, the write reference voltage VREF_WR conveyed on node 231 is compared to the amplifier output node 258, and a voltage is generated accordingly on the common control node 256.

Alternatively, if memory array 204 is enabled for write, the amplifier output node 259 is coupled through switch 232 to the non-inverting input node 235 of comparator 230, whose output is coupled through switch 248 to the common control node 257. The switches 234 and 238 remain off. Consequently, the write reference voltage VREF_WR conveyed on node 231 is compared to the amplifier output node 259, and a voltage is generated accordingly on the common control node 257.

In a similar fashion, a single read amplifier comparator 240 is used to provide a suitable level on the common control node for the memory array that is enabled for read. For example, if memory array 154 is enabled for read, the amplifier output node 258 is coupled through switch 242 to the inverting input node 245 of comparator 240, whose output is coupled through switch 240 to the common control node 256. The switches 244 and 250 remain off. Consequently, the read reference voltage VREF_RD conveyed on node 241 is compared to the amplifier output node 258, and a voltage is generated accordingly on the common control node 256.

Alternatively, if memory array 204 is enabled for read, the amplifier output node 259 is coupled through switch 244 to the inverting input node 245 of comparator 240, whose output is coupled through switch 250 to the common control node 257. The switches 242 and 248 remain off. Consequently, the read reference voltage VREF_RD conveyed on node 241 is compared to the amplifier output node 259, and a voltage is generated accordingly on the common control node 257.

The write comparator 230 is enabled by an EN_WR signal conveyed on node 233, and the read comparator 240 is enabled by an EN_RD signal conveyed on node 243. Four control signals EN_RD_0, EN_RD_1, EN_WR_0, and EN_WR_1 are used to control the various switches which couple the input and output of the read and write comparators for each mode of operation. Such switches may be implemented in a variety of ways, including full CMOS transfer gates (using complementary enable signals), a partial transfer gate, and others.

It should be appreciated that the distributed final amplifier stages within each memory array may be identical with an analogous circuit implemented for a single memory array. This provides for a "dual core" architecture that can be implemented with minimal change or additional complexity to the actual memory core (i.e., array) and the distributed amplifier stages therewithin. In addition, the VOUT voltage within one array is the same as in the single array case. This is an improvement over other dual core power schemes, such as those in which read and write voltages are both distributed to both cores simultaneously. Moreover, this embodiment provides for reading one memory core while writing another memory core, using only a single read amplifier (e.g., comparator 240) and a single write amplifier (e.g., comparator 230). This, too, is an improvement over other possible dual core power schemes, in which there may be two amplifiers (read+write) for each core, for a total of 4 amplifiers.

In other embodiments, more than one read amplifier may be provided so that both cores can be read at the same time. Similarly, more than one write amplifier may be provided so that both cores can be written at the same time.

Referring now to FIG. 4, an amplifier circuit 300 is shown which may be viewed as generalizing certain embodiments of the invention. This amplifier circuit 300 generates an output signal on a shared amplifier output node 306 which may be distributed throughout a memory array 301. Two groups of distributed final amplifier stages are shown. The first group includes spatially distributed final amplifier stages 321, 323, and 325, each of which is responsive to an ENABLE_A signal conveyed on node 311. The second group includes spatially distributed final amplifier stages 320, 322, and 324, each of which is responsive to an ENABLE_B signal conveyed on node 312. The final amplifier stages of the first group differ in configuration relative to the final amplifier stages of the second group.

In this embodiment a reference voltage generator 302 is enabled by either the ENABLE_A signal or the ENABLE_B signal to generate a single VREF output on node 303 which is coupled to an amplifier input node. The magnitude of the voltage of the VREF output depends on which of the two amplifier modes is enabled. A feedback circuit 304, when enabled by either the ENABLE_A signal or the ENABLE_B signal, compares the voltage of the amplifier output node 306 against the reference voltage VREF, and accordingly generates a shared control node 305 voltage sufficient to cause the amplifier output node 306 voltage to be driven to match the VREF 303 voltage. Such a feedback circuit may include one or more differential amplifiers, comparators, pre-amplifiers, switches, and/or other components which provide for the control node to be driven responsive to the amplifier output node voltage and the reference voltage. The distributed final amplifier stages 321, 323, 325 for the "A" amplifier and the distributed final amplifier stages 320, 322, 324 for the "B" amplifier are coupled to one or more other signal nodes 310 (e.g., power supply voltage, bias voltage, etc.).

Figure 5:
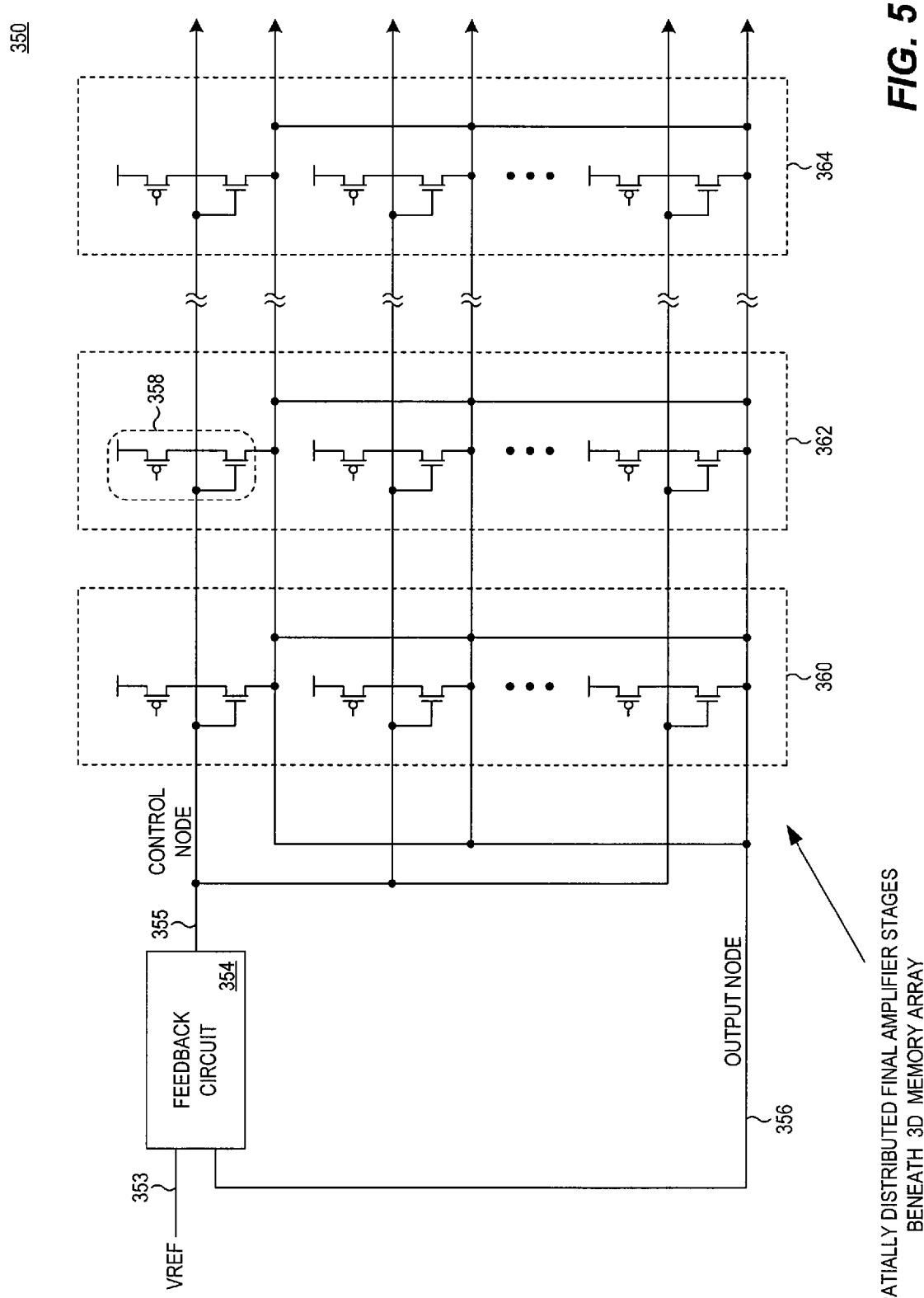
FIG. 5 is a block diagram of an amplifier circuit having spatially distributed final amplifier stages disposed throughout a memory array, in accordance with certain embodiments of the present invention.

Referring now to FIG. 5, an amplifier circuit 350 is shown which includes spatially distributed final amplifier stages (e.g., stage 358) disposed beneath a three-dimensional (3D) memory array, such as an array formed above a semiconductor substrate. A feedback circuit 354 is provided which compares the amplifier output node 356 voltage to a reference voltage VREF, and drives a control node 355 appropriately.

Also depicted is a single group of spatially distributed final amplifier stages, which are all simultaneously enabled or disabled by one or more control signals not shown in the figure. As before, each of the final amplifier stages is coupled to the shared amplifier output node 356 which is distributed throughout a memory array, which is here depicted as including three memory array blocks 360, 362, and 364. In certain embodiments, the memory array is a three-dimensional memory array (e.g., formed above a semiconductor substrate), and the spatially distributed final amplifier stages are disposed beneath the memory array (e.g., formed generally within the semiconductor substrate).

Figure 6:
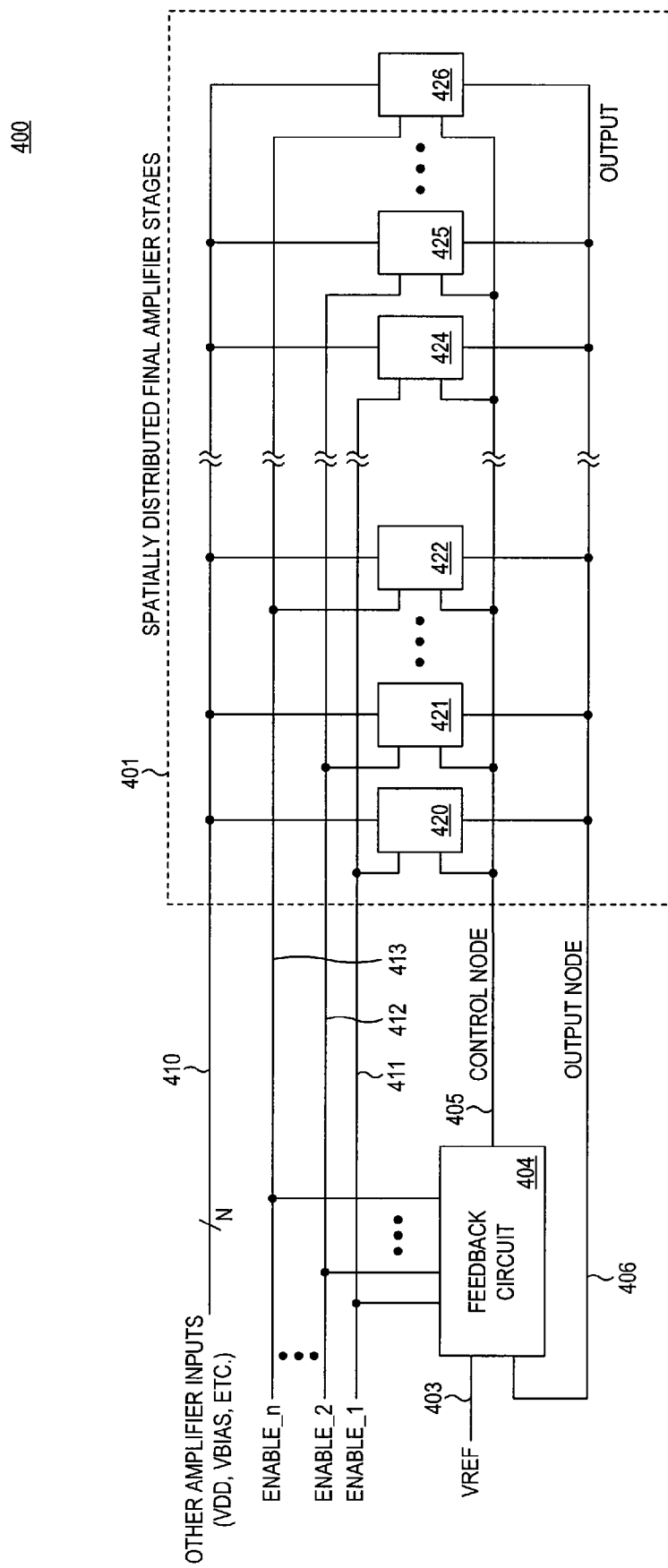
FIG. 6 is a block diagram of another amplifier circuit in accordance with certain embodiments of the present invention.

Referring now to FIG. 6, an amplifier circuit 400 is shown which utilizes more than two groups of distributed final amplifier stages. This amplifier circuit 400 generates an output signal on a shared amplifier output node 306 which is distributed throughout an integrated circuit or a portion thereof. Multiple groups (e.g., three, four, or up to "n" groups) of distributed final amplifier stages 401 are shown. The first group includes spatially distributed final amplifier stages 420, . . . , 424, each of which is responsive to an ENABLE_1 signal conveyed on node 411. The second group includes spatially distributed final amplifier stages 421, . . . , 425, each of which is responsive to an ENABLE_2 signal conveyed on node 412. The "nth" group includes spatially distributed final amplifier stages 422, . . . , 426, each of which is responsive to an ENABLE_n signal conveyed on node 413. The final amplifier stages of each group preferably differ in configuration relative to the final amplifier stages of the other groups. In addition, the final amplifier stages are coupled to one or more other amplifier inputs, such as power supply nodes, internally generated voltage supply nodes, bias voltage nodes, reference voltage nodes, etc., conveyed on node(s) 410.

In this embodiment a reference voltage is conveyed on node 403 to a feedback circuit 404. This feedback circuit 404 is coupled to each of the various enable signals, and when enabled for a given amplifier configuration, compares the voltage of the amplifier output node 406 against the reference voltage VREF, and accordingly generates the shared control node signal conveyed on node 405. Each individual enable signal 411, 412, 413 may affect appropriate configuration changes in the feedback circuit 404, including generating additional reference voltages appropriate for the particular amplifier mode, and coupling various internal nodes to either inputs or outputs of various internal circuits therein, so as to generate a voltage on the control node 405 appropriate for the configuration of the distributed final amplifier stages and appropriate for the desired amplifier output 406 voltage.

Figure 7:
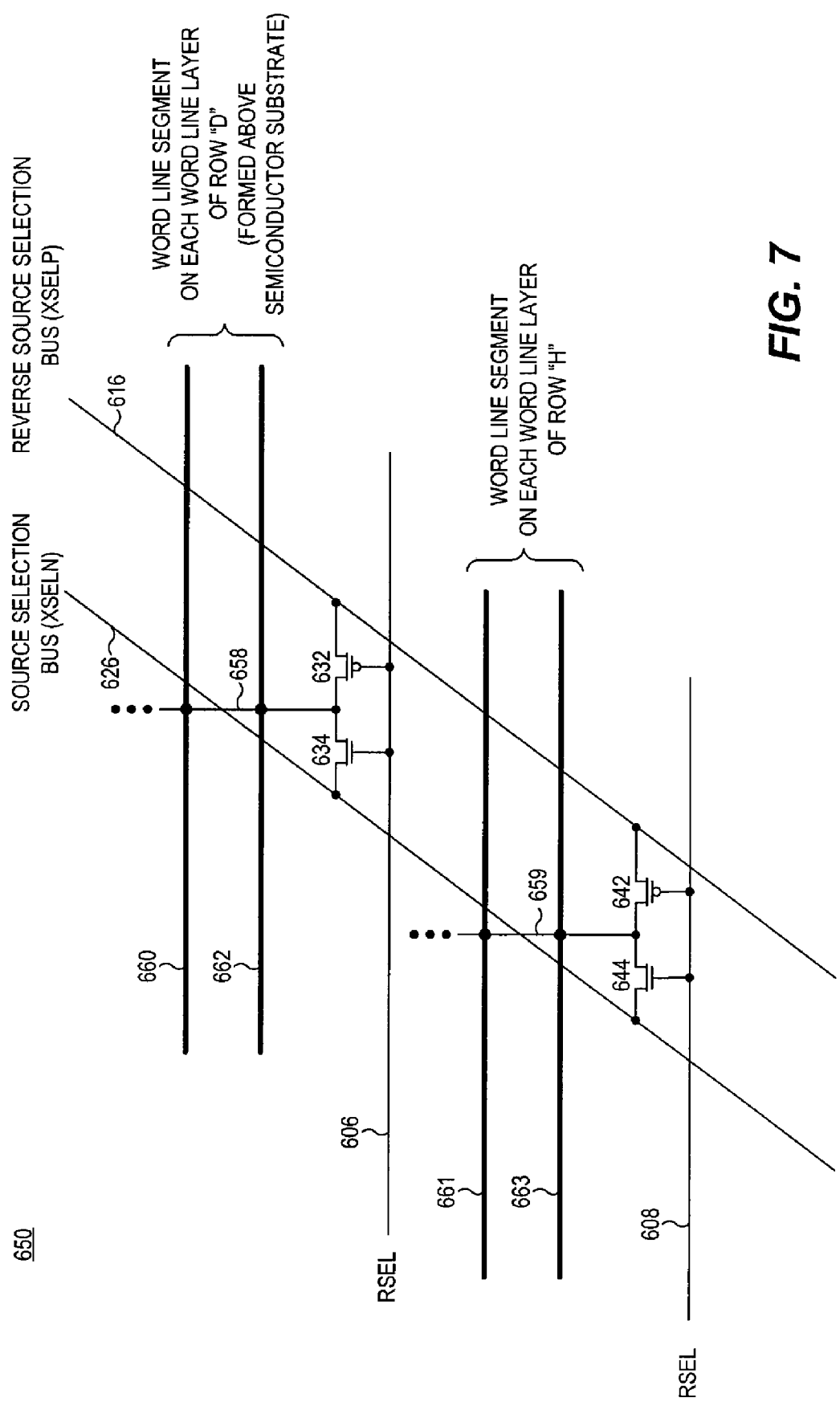
FIG. 7 is a block diagram of a memory array useful with certain embodiments of the present invention.

Referring now to FIG. 7, an exemplary memory array 650 is depicted. This figure is a three-dimensional view depicting a portion of a three-dimensional memory array having a segmented word line arrangement. Each word line is formed by one or more word line segments on at least one, and advantageously more than one, word line layer of the memory array. For example, a first word line is formed by word line segment 660 disposed on one word line layer of the memory array and by word line segment 662 disposed on another word line layer. The word line segments 660, 662 are connected by a vertical connection 658 to form the first word line. The vertical connection 658 also provides a connection path to the word line driver devices 632, 634 which are preferably disposed in another layer (e.g., within the semiconductor substrate). A global row select line RSEL output 606 from a global row decoder (not shown) at times couples the word line segments 660, 662 through device 634 to a decoded source selection bus line XSELN 626, and at other times couples the word line segments 660, 662 through device 632 to a decoded reverse source selection bus line XSELP 616. Also shown are word line segments 661, 663 which are connected by a vertical connection 659 to form a second word line and to provide a connection path to the word line driver circuit 642, 644, which is coupled to a second row select RSEL output 608.

Figure 8:
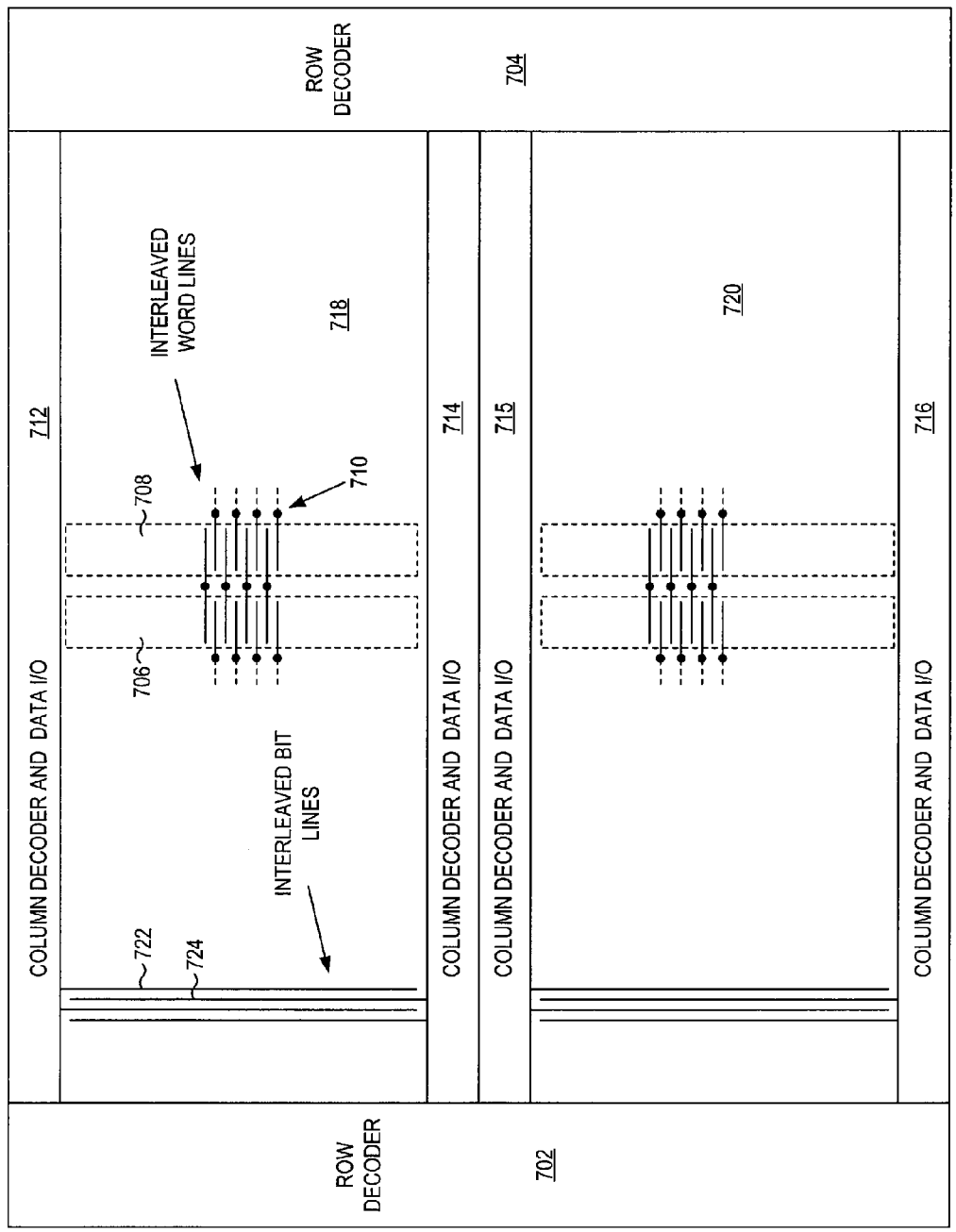
FIG. 8 is a block diagram depicting an exemplary integrated circuit including a three-dimensional memory array useful with certain embodiments of the present invention.

FIG. 8 is a block diagram of an exemplary circuit 700 including two memory arrays 718, 720. Dual row decoders 702, 704 generate row select lines for the array, which each traverse across the memory arrays 718, 720. In this embodiment, the word line driver circuits (not shown) are spatially distributed beneath the memory array and make connection to the word lines by way of vertical connections (one of which is labeled 710) on alternating sides of individual memory array blocks (two of which are labeled 706, 708). The circuit 700 further includes four column decoder and bit line and I/O circuit blocks 712, 714, 715, 716 respectively at the top, upper middle, lower middle, and bottom of the circuit. Additional arrays may also be incorporated. The bit lines within each memory array block may be 2:1 interleaved to relax the pitch requirements of the column related circuitry. As an example, bit line 722 is associated with (i.e., driven and sensed by) the top column circuits block 712, while bit line 724 is associated with the upper middle column circuits block 714.

In exemplary embodiments, the memory circuit 700 includes a three-dimensional memory array of passive element memory cells formed on each of four memory planes. Such memory cells preferably incorporate a trimmable resistor element and may also include an antifuse. Each logical word line is connected to a word line segment on each of four word line layers (each associated with a respective memory plane).

Each array 718, 720 of the exemplary memory circuit 700 may be divided into a large number of blocks, such as block 708. In a selected memory array block, one of "N" source selection bus lines XSELN (or reverse source selection bus lines XSELP) is decoded and driven to an active bias condition by a row bias circuit (not shown), and the remaining N−1 bus lines XSELN (also called "bias lines") are driven to an inactive condition (i.e., a voltage suitable for an unselected word line). Consequently, a single selected RSEL line preferably drives one word line active in the selected memory block, and drives N−1 word lines in the selected block to an unselected bias level. In other non-selected memory blocks, none of the individual bus lines of the source and reverse source selection busses are driven active, so that no word lines are selected by the active RSEL line. The amplifier output node as depicted in the various embodiments described above, which are distributed throughout a memory array, may be coupled to such row bias circuits to provide suitable voltages, for example, on selected or unselected word lines within the memory array, or in other embodiments, suitable voltages on other array lines within the memory array.

Exemplary memory arrays, useful decoding circuits, bias conditions, modes of operation including read and program modes, and the like, are further described in U.S. Pat. No. 7,054,219 to Christopher J. Petti, et al., the disclosure of which is hereby incorporated by reference in its entirety; in U.S. Pat. No. 6,856,572 to Roy E. Scheuerlein, et al., the disclosure of which is hereby incorporated by reference in its entirety; in U.S. Pat. No. 6,859,410 to Roy E. Scheuerlein, et al., the disclosure of which is hereby incorporated by reference in its entirety; in U.S. Pat. No. 7,142,471 to Luca G. Fasoli, et al., the disclosure of which is hereby incorporated by reference in its entirety; in U.S. Pat. No. 6,879,505 to Roy E. Scheuerlein, the disclosure of which is hereby incorporated by reference in its entirety; in U.S. Application Publication No. 2006-0221702 A1 by Roy E. Scheuerlein, et al., entitled "Decoding Circuit for Non-Binary Groups of Memory Line Drivers", the disclosure of which is hereby incorporated by reference in its entirety; and in U.S. Patent Application Publication No. 2006-0146639 A1 entitled "Apparatus and Method for Hierarchical Decoding of Dense Memory Arrays Using Multiple Levels of Multiple-Headed Decoders," by Luca G. Fasoli, et al., the disclosure of which is hereby incorporated by reference in its entirety.

For certain memory technologies in which the array is fabricated on layers other than the substrate, such as for a monolithic three-dimensional memory array fabricated above a semiconductor substrate, certain circuits described above may be implemented beneath a memory sub-array, rather than requiring area outside of the memory array. Exemplary monolithic three-dimensional memory arrays which may be fabricated above a semiconductor substrate are described in U.S. Pat. No. 6,034,882 to Johnson, et al.; in U.S. Pat. No. 6,420,215 to N. Johan Knall, et al.; in U.S. Pat. No. 6,525,953 to Johnson, et al.; in U.S. Pat. No. 6,952,043 to Vyvoda, et al.; and in U.S. Pat. No. 6,545,898 to Scheuerlein, et al., the disclosures of which are hereby incorporated by reference in their entirety.

As used herein, an integrated circuit having a three-dimensional memory array is assumed to be a monolithic integrated circuit, rather than an assembly of more than one monolithic integrated circuit. The methods and apparatus of the present invention may also be used to advantage in monolithic three dimensional memories such as, for example, a three-dimensional, non-volatile, field-programmable memory array (both write-once and/or re-writable memory arrays). Moreover, the methods and apparatus of the present invention may also be used to advantage in integrated circuits including two-dimensional arrays, and in many other non-memory integrated circuits.

Many types of memory cells are capable of being programmed using a reverse bias. Such cells include a passive element cell having a metal oxide (e.g., a transition metal oxide) and a diode. Other suitable cells include those having a resistive material being programmed between a low R state and a high R state with a diode select element. Examples include a programmable metallization connection, a phase change resistor such as GST material, an organic material variable resistor, a complex metal oxide, a carbon polymer film, a carbon nanotube resistor, a doped chalcogenide glass, and a Schottky barrier diode containing mobile atoms to change resistance. The resistive material chosen may provide one-time-programmable (OTP) memory cells, or write-many memory cells. In addition, a polysilicon diode could be employed having conduction modified by reverse bias stress.

Descriptions of useful two-terminal memory cells are provided in the following papers which are hereby incorporated herein by reference: (i) Pirovano et al., "Electronic Switching in Phase-Change Memories," IEEE Transactions on Electronic Devices, Vol. 51, No. 3, March 2003; (ii) Baek et al., "Multi-layer Cross-point Binary Oxide Resistive Memory (OxRRAM) for Post-NAND Storage Application," IEEE International Electron Devices Meeting, 2005; (iii) Baek et al., "Highly Scalable Non-volatile Resistive Memory using Simple Binary Oxide Driven by Asymmetric Unipolar Voltage Pulses," IEEE International Electron Devices Meeting, 2004; and (iv) Hwang et al., "Writing Current Reduction for High-Density Phase-Change RAM," IEEE International Electron Devices Meeting, 2003. Additional details are also provided in U.S. Pat. No. 6,891,748 to Tsichuda, which is hereby incorporated herein by reference.

Other useful memory cells are described in U.S. Pat. No. 6,952,030 entitled "High-Density Three-Dimensional Memory Cell" to S. Brad Herner, et al.; and also in U.S. application Ser. No. 11/237,167, now U.S. Patent Application Publication No. 2007-0090425, entitled "Method for Using a Memory Cell Comprising Switchable Semiconductor Memory Element with Trimmable Resistance" by Tanmay Kumar, et al., filed on Sep. 28, 2005. A suitable metal oxide memory cell is shown in U.S. application Ser. No. 11/394,903, now U.S. Patent Application Publication No. 2007-0236981, filed on Mar. 31, 2006, entitled "Multilevel Nonvolatile Memory Cell Comprising a Resistivity-Switching Oxide or Nitride and an Antifuse" by S. Brad Herner. A suitable memory cell using a phase change material, which can provide multiple resistance states, is shown in U.S. Patent Application Publication No. 2005-0158950 entitled "Non-Volatile Memory Cell Comprising a Dielectric Layer and a Phase Change Material in Series" by Roy E. Scheuerlein, et al. Other exemplary memory cells having a transition-metal oxide (e.g., including those having cobalt), and exemplary cells in which the polysilicon material of the steering element itself comprises the switchable resistance material, are described in U.S. application Ser. No. 11/496,986, now U.S. Patent Application Publication No. 2007-0072360, filed Jul. 31, 2006 entitled "Method for Using a Memory Cell Comprising Switchable Semiconductor Memory Element with Trimmable Resistance" by Tanmay Kumar, S. Brad Herner, Roy E. Scheuerlein, and Christopher J. Petti. Each of these above-referenced disclosures is incorporated herein by reference in its entirety.

In addition, U.S. application Ser. No. 11/125,939 filed on May 9, 2005, entitled "Rewritable Memory Cell Comprising a Diode and a Resistance Switching Material" by S. Brad Herner, et al., discloses a useful rewritable memory cell incorporating a diode in series with an oxide, such as a nickel oxide, in which the resistance of the memory cell may be repeatedly switched from low to high and from high to low resistance states. U.S. application Ser. No. 11/395,995 filed on Mar. 31, 2006, entitled "Nonvolatile Memory Cell Comprising a Diode and a Resistance Switching Material" by S. Brad Herner, et al., discloses a OTP multi-level memory cell which is set using forward bias and reset using reverse bias. Each of these above-referenced disclosures is incorporated herein by reference in its entirety.

As used herein, a circuit's configuration contemplates transistor type as well as topology. For example, two circuits connected identically in a topological sense, but using different type transistors, are viewed as having different circuit configurations.

Certain embodiments described above depict final amplifier stages that are spatially distributed across a memory array, although such is not necessarily required unless explicitly recited in a claim. Other embodiments having spatially distributed final amplifier stages need not be spatially distributed across a memory array, but may be distributed across any suitable integrated circuit or portion thereof. The use herein of descriptive terms such as pre-amplifier, comparator, differential amplifier, and the like should not be inferred to imply any specific levels of the input and output voltages thereof Certain embodiments described above may be seen as enabling at most a single group of spatially distributed final amplifier stages (e.g., either the "A" amplifier stages or the "B" amplifier stages). However, such stages are not necessarily enabled in a mutually exclusive fashion. For example, two groups of distributed amplifier stages could be enabled at the same time for one mode of operation, but only one group of distributed amplifier stages for a second mode of operation.

Certain embodiments described herein include a switch device for enabling a given final amplifier stage, which device has an enable signal coupled to its gate terminal. The final amplifier stage is shown as being enabled when the enable signal is driven to an appropriate voltage to turn on such switch device. However, other methods and configurations are contemplated for enabling a final amplifier stage. For example, such a switch device need not be a PMOS device. As another example, a switch device in series with a control device may be reversed in order to that shown herein. As another example, a switched power supply may be used, with no explicit switch device included within each final amplifier stage.

Regarding general terminology used herein, it will be appreciated by one skilled in the art that any of several expressions may be equally well used when describing the operation of a circuit including the various signals and nodes within the circuit. Any kind of signal, whether a logic signal or a more general analog signal, takes the physical form of a voltage level (or for some circuit technologies, a current level) of a node within the circuit. It may be correct to think of signals being conveyed on wires or buses. For example, one might describe a particular circuit operation as "the output of circuit 10 drives the voltage of node 11 toward VDD, thus asserting the signal OUT conveyed on node 11." This is an accurate, albeit somewhat cumbersome expression. Consequently, it is well known in the art to equally describe such a circuit operation as "circuit 10 drives node 11 high," as well as "node 11 is brought high by circuit 10," "circuit 10 pulls the OUT signal high" and "circuit 10 drives OUT high." Such shorthand phrases for describing circuit operation are more efficient to communicate details of circuit operation, particularly because the schematic diagrams in the figures clearly associate various signal names with the corresponding circuit blocks and node names. For convenience, an otherwise unnamed node conveying the CLK signal may be referred to as the CLK node. Similarly, phrases such as "pull high," "drive high," and "charge" are generally synonymous unless otherwise distinguished, as are the phrases "pull low," "drive low," and "discharge." It is believed that use of these more concise descriptive expressions enhances clarity and teaching of the disclosure. It is to be appreciated by those skilled in the art that each of these and other similar phrases may be interchangeably used to describe common circuit operation, and no subtle inferences should be read into varied usage within this description.

A transistor may be conceptualized as having a control terminal which controls the flow of current between a first current handling terminal (or current carrying terminal) and a second current handling terminal. An appropriate condition on the control terminal causes a current to flow from/to the first current handling terminal and to/from the second current handling terminal (for typical operating voltages of the first and second current handling terminals). In a bipolar transistor, the first current handling terminal may be deemed the emitter, the control terminal deemed the base, and the second current handling terminal deemed the collector. An MOS transistor may likewise be conceptualized as having a control terminal which controls the flow of current between a first current handling terminal and a second current handling terminal. Although MOS transistors are frequently discussed as having a drain, a gate, and a source, in most such devices the drain is interchangeable with the source. This is because the layout and semiconductor processing of the transistor is symmetrical (which is typically not the case for bipolar transistors). For an N-channel MOS transistor, the current handling terminal normally residing at the higher voltage is customarily called the drain. The current handling terminal normally residing at the lower voltage is customarily called the source.

A sufficiently high voltage on the gate (relative to the source voltage) causes a current to therefore flow from the drain to the source (provided the respective voltage of the drain and source are different). For an enhancement mode N-channel device, a positive gate-to-source voltage greater than the threshold voltage (including body effect) is sufficient. The source voltage referred to in N-channel MOS device equations merely refers to whichever current handling terminal has the lower voltage at any given point in time. For example, the "source" of the N-channel device of a bi-directional CMOS transfer gate depends on which side of the transfer gate is at the lower voltage. To reflect this symmetry of most N-channel MOS transistors, the control terminal may be deemed the gate, the first current handling terminal may be termed the "drain/source", and the second current handling terminal may be termed the "source/drain". Such a description is equally valid for a P-channel MOS transistor, since the polarity between drain and source voltages, and the direction of current flow between drain and source, is not implied by such terminology. Alternatively, one current handling terminal may arbitrarily deemed the "drain" and the other deemed the "source", with an implicit understanding that the two are not distinct, but interchangeable.

Regarding power supplies, a single positive power supply voltage (e.g., a 2.5 volt power supply) used to power a circuit is frequently named the "VDD" power supply. In an integrated circuit, transistors and other circuit elements are actually connected to a VDD terminal or a VDD node, which is then operably connected to the VDD power supply. The colloquial use of phrases such as "tied to VDD" or "connected to VDD" is understood to mean "connected to the VDD node", which is typically then operably connected to actually receive the VDD power supply voltage during use of the integrated circuit.

The reference voltage for such a single power supply circuit is frequently called "VSS." Transistors and other circuit elements are actually connected to a VSS terminal or a VSS node, which is then operably connected to the VSS power supply during use of the integrated circuit. Frequently the VSS terminal is connected to a ground reference potential, or just "ground." Describing a node which is "grounded" by a particular transistor or circuit (unless otherwise defined) means the same as being "pulled low" or "pulled to ground" by the transistor or circuit.

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word.

While circuits and physical structures are generally presumed, it is well recognized that in modern semiconductor design and fabrication, physical structures and circuits may be embodied in computer readable descriptive form suitable for use in subsequent design, test or fabrication activities as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. The invention is contemplated to include circuits, related methods or operation, related methods for making such circuits, and computer-readable medium encodings of such circuits and methods, all as described herein, and as defined in the appended claims. As used herein, a computer-readable medium includes at least disk, tape, or other magnetic, optical, semiconductor (e.g., flash memory cards, ROM), or electronic medium and a network, wireline, wireless or other communications medium. An encoding of a circuit may include circuit schematic information, physical layout information, behavioral simulation information, and/or may include any other encoding from which the circuit may be represented or communicated.

The foregoing detailed description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. Moreover, the embodiments described above are specifically contemplated to be used alone as well as in various combinations. It is only the following claims, including all equivalents, that are intended to define the scope of this invention. Accordingly, other embodiments, variations, and improvements not described herein are not necessarily excluded from the scope of the invention.

What is claimed is:

1. A circuit comprising:
   an amplifier control node;
   an amplifier output node;
   a first plurality of spatially distributed final amplifier stages, each having a respective input coupled to the amplifier control node, each having a respective output coupled to the amplifier output node, and each comprising a first circuit configuration; and
   a second plurality of spatially distributed final amplifier stages, each having a respective input coupled to the amplifier control node, each having a respective output coupled to the amplifier output node, and each comprising a second circuit configuration different from the first circuit configuration in at least one of circuit topology and transistor type.

2. The circuit as recited in claim 1 further comprising:
   feedback means, responsive to the amplifier output node, for generating a first signal on the amplifier control node in a first mode of operation, and for generating a second signal on the amplifier control node in a second mode of operation; and
   means for enabling the first plurality of final amplifier stages in the first mode of operation, and for enabling the second plurality of final amplifier stages in the second mode of operation.

3. The circuit as recited in claim 2 wherein said feedback means comprises:
   a first pre-amplifier circuit for generating, when enabled in the first mode of operation, the first signal on the amplifier control node; and
   a second pre-amplifier circuit for generating, when enabled in the second mode of operation, the second signal on the amplifier control node.

4. The circuit as recited in claim 2 wherein:
   the first plurality of final amplifier stages are enabled at different times than are the second plurality of final amplifier stages.

5. The circuit as recited in claim 2 wherein:
   the first circuit configuration comprises a source follower configuration.

6. The circuit as recited in claim 2 wherein:
   the second circuit configuration comprises a common gate amplifier configuration.

7. The circuit as recited in claim 2 further comprising:
a memory array including array lines;
wherein the first and second plurality of final amplifier stages are spatially distributed across the memory array; and
wherein the amplifier output node is coupled to provide, in the first mode of operation, a first voltage to certain array lines within the memory array, and to provide, in the second mode of operation, a second voltage to certain array lines within the memory array.

8. The circuit as recited in claim 7 wherein:
the first mode of operation comprises a read mode; and
the second mode of operation comprises a write mode.

9. The circuit as recited in claim 7 wherein:
the memory array comprises a three-dimensional memory array formed above a substrate; and
the first and second plurality of final amplifier stages are disposed beneath the memory array.

10. The circuit as recited in claim 9 wherein:
the memory array comprises a passive element memory array.

11. The circuit as recited in claim 10 wherein:
the passive element memory array comprises variable resistance memory cells.

12. The circuit as recited in claim 7 wherein the first plurality of final amplifier stages each respectively comprises:
a source follower device responsive to the amplifier control node; and
a switch device responsive to a first enable signal;
wherein said source follower device and said switch device are coupled in series between an associated voltage supply node and the amplifier output node.

13. The circuit as recited in claim 12 wherein the second plurality of final amplifier stages each respectively comprises:
a common gate device responsive to the amplifier control node; and
a switch device responsive to a second enable signal;
wherein said common gate device and said switch device are coupled in series between an associated voltage supply node and the amplifier output node.

14. The circuit as recited in claim 13 wherein:
the voltage supply node associated with the first plurality of final amplifier stages is identical to the voltage supply node associated with the second plurality of final amplifier stages.

15. The circuit as recited in claim 2 wherein the first and second plurality of final amplifier stages each respectively comprises:
a first transistor having a control terminal coupled to the amplifier control node, having a first current handling terminal coupled to the amplifier output node, and having a second current handling terminal coupled to a first internal node; and
a second transistor having a control terminal coupled to an associated enable signal node, having a first current handling terminal coupled to the first internal node, and having a second current handling terminal coupled to an associated voltage supply node;
wherein one of the first and second transistors of the first plurality of final amplifier stages comprises a conductivity type opposite that of the corresponding first or second transistor of the second plurality of final amplifier stages.

16. The circuit as recited in claim 15 wherein:
the first and second transistors of the first plurality of final amplifier stages comprises transistors having opposite conductivity type; and
the first and second transistors of the second plurality of final amplifier stages comprises transistors having the same conductivity type.

17. The circuit as recited in claim 15 wherein said feedback means comprises:
a first pre-amplifier circuit having a first input coupled to a reference voltage node, having a second input coupled to the amplifier output node, and having an output coupled to the amplifier control node.

18. The circuit as recited in claim 17 wherein said feedback means further comprises:
a second pre-amplifier circuit having a first input coupled to a reference voltage node, having a second input coupled to the amplifier output node, and having an output coupled to the amplifier control node.

19. The circuit as recited in claim 17 wherein:
the first transistor of the first plurality of final amplifier stages each respectively comprises an NMOS transistor:
the first transistor of the second plurality of final amplifier stages each respectively comprises a PMOS transistor;
the second transistor of the first plurality of final amplifier stages each respectively comprises a PMOS transistor; and
the second transistor of the second plurality of final amplifier stages each respectively comprises a PMOS transistor.

20. The circuit as recited in claim 1 further comprising:
a second amplifier control node;
a second amplifier output node;
a third plurality of spatially distributed final amplifier stages, each having a respective input coupled to the second amplifier control node, each having a respective output coupled to the second amplifier output node, and each comprising the first circuit configuration;
a fourth plurality of spatially distributed final amplifier stages, each having a respective input coupled to the second amplifier control node, each having a respective output coupled to the second amplifier output node, and each comprising the second circuit configuration; and
means for enabling simultaneously the first plurality of final amplifier stages and the fourth plurality of final amplifier stages.

21. The circuit as recited in claim 20 further comprising:
first and second memory arrays, each including respective array lines;
wherein the first and second plurality of final amplifier stages are spatially distributed across the first memory array;
wherein the third and fourth plurality of final amplifier stages are spatially distributed across the second memory array;
wherein the first-mentioned amplifier output node is coupled to provide, in a first mode of operation for the first memory array, a first voltage to certain array lines within the first memory array, and to provide, in a second mode of operation for the first memory array, a second voltage to certain array lines within the first memory array; and
wherein the second amplifier output node is coupled to provide, in the first mode of operation for the second memory array, a first voltage to certain array lines within the second memory array, and to provide, in the second mode of operation for the second memory array, a second voltage to certain array lines within the second memory array.

22. The circuit as recited in claim 21 further comprising feedback means for generating:
- a first signal on the first-mentioned amplifier control node in a first mode of operation for the first memory array;
- a second signal on the first amplifier control node in a second mode of operation for the first memory array;
- a first signal on the second amplifier control node in a first mode of operation for the second memory array; and
- a second signal on the second amplifier control node in a second mode of operation for the second memory array.

23. The circuit as recited in claim 22 wherein the feedback means comprises:
- a first pre-amplifier circuit having a first input selectively coupled to one of the first and second amplifier output nodes, and having an output selectively coupled to one of the first and second amplifier control nodes; and
- a second pre-amplifier circuit having a first input selectively coupled to one of the first and second amplifier output nodes, and having an output selectively coupled to one of the first and second amplifier control nodes.

24. The circuit as recited in claim 23 further comprising:
- first means for enabling the first plurality of final amplifier stages and for coupling the first input of the first pre-amplifier circuit to the first amplifier output node, and for coupling the output of the first pre-amplifier circuit to the first amplifier control node, for the first mode of operation for the first memory array; and
- second means for enabling the second plurality of final amplifier stages and for coupling the first input of the second pre-amplifier circuit to the first amplifier output node, and for coupling the output of the second pre-amplifier circuit to the first amplifier control node, for the second mode of operation for the first memory array.

25. The circuit as recited in claim 24 further comprising:
- third means for enabling the third plurality of final amplifier stages and for coupling the first input of the first pre-amplifier circuit to the second amplifier output node, and for coupling the output of the first pre-amplifier circuit to the second amplifier control node, for the first mode of operation for the second memory array; and
- fourth means for enabling the fourth plurality of final amplifier stages and for coupling the first input of the second pre-amplifier circuit to the second amplifier output node, and for coupling the output of the second pre-amplifier circuit to the second amplifier control node, for the second mode of operation for the second memory array.

26. The circuit as recited in claim 1 embodied in a computer-readable form suitable for design, test, or manufacturing of an integrated circuit.

* * * * *